United States Patent [19]

El-Avat et al.

[11] Patent Number: 5,451,887
[45] Date of Patent: Sep. 19, 1995

[54] PROGRAMMABLE LOGIC MODULE AND ARCHITECTURE FOR FIELD PROGRAMMABLE GATE ARRAY DEVICE

[75] Inventors: Khaled A. El-Avat, Cupertino; Sinan Kaptanoglu, San Carlos; King W. Chan, Los Altos; William C. Plants; Jung-Cheun Lien, both of Santa Clara, all of Calif.

[73] Assignee: Actel Corporation, Sunnyvale, Calif.

[21] Appl. No.: 246,218

[22] Filed: May 19, 1994

Related U.S. Application Data

[60] Continuation-in-part of Ser. No. 2,873, Jan. 13, 1993, Pat. No. 5,367,208, which is a continuation of Ser. No. 869,488, Apr. 15, 1992, Pat. No. 5,187,393, which is a continuation of Ser. No. 621,452, Jan. 15, 1991, Pat. No. 5,172,014, which is a division of Ser. No. 309,306, Feb. 10, 1989, Pat. No. 5,015,885, which is a continuation-in-part of Ser. No. 195,728, May 18, 1988, Pat. No. 4,873,459, which is a continuation-in-part of Ser. No. 909,261, Sep. 19, 1986, Pat. No. 4,758,745.

[51] Int. Cl.[6] .......................... H03K 19/177
[52] U.S. Cl. ............................ 326/39; 326/40; 326/41
[58] Field of Search ..................... 326/37–40, 326/41

[56] References Cited

U.S. PATENT DOCUMENTS

| | | | |
|---|---|---|---|
| 3,818,452 | 4/1972 | Greer | 340/166 R |
| 3,849,638 | 11/1974 | Greer | 235/152 |
| 3,987,287 | 10/1976 | Cox et al. | 235/152 |
| 4,207,556 | 6/1980 | Sugiyama et al. | 340/166 R |
| 4,293,783 | 10/1981 | Patil | 307/465 |
| 4,348,737 | 9/1982 | Cukier | 364/900 |
| 4,433,331 | 2/1984 | Kollaritisch | 340/825.83 |
| 4,642,487 | 2/1987 | Carter | 307/465 |
| 4,691,161 | 9/1987 | Kant et al. | 324/73 R |
| 4,758,745 | 7/1988 | Elgamal et al. | 307/465 |
| 4,758,985 | 7/1988 | Carter | 365/94 |
| 4,786,904 | 11/1988 | Graham, III et al. | 340/825.83 |
| 4,825,105 | 4/1989 | Holzle | 307/440 |
| 4,847,612 | 7/1989 | Kaplinsky | 340/825.8 |
| 4,873,459 | 10/1989 | El Gamal et al. | 307/465 |
| 4,903,223 | 2/1990 | Norman et al. | 364/716 |
| 4,910,417 | 3/1990 | El Gamal et al. | 307/465 |
| 4,912,342 | 3/1990 | Wong et al. | 307/465 |
| 4,933,577 | 6/1990 | Wong et al. | 307/465 |
| 4,963,768 | 10/1990 | Agrawal et al. | 307/465 |
| 4,963,770 | 10/1990 | Keida | 307/465 |
| 5,001,368 | 3/1991 | Cliff et al. | 307/465 |
| 5,055,718 | 10/1991 | Galbraith | 307/465 |
| 5,089,973 | 2/1992 | Furtek | 326/39 X |
| 5,132,571 | 7/1992 | McCollum | 307/465.1 |
| 5,144,166 | 9/1992 | Camarota et al. | 307/465.1 |
| 5,172,014 | 12/1992 | El Ayat et al. | 307/465 |
| 5,187,393 | 2/1993 | El Gamal et al. | 307/465.1 |
| 5,208,491 | 5/1993 | Ebeling et al. | 307/465 |
| 5,220,213 | 6/1993 | Chan et al. | 307/465 |
| 5,231,588 | 7/1993 | Agrawal et al. | 364/489 |
| 5,245,227 | 9/1993 | Furtek et al. | 307/465 |
| 5,258,668 | 11/1993 | Cliff et al. | 307/465 |
| 5,260,610 | 11/1993 | Pederson et al. | 307/465 |
| 5,302,866 | 4/1994 | Chiang et al. | 307/465 |
| 5,317,210 | 5/1994 | Patel | 307/465 |
| 5,327,023 | 7/1994 | Kawana et al. | 326/39 |
| 5,329,180 | 7/1994 | Popli et al. | 326/39 |
| 5,329,460 | 7/1994 | Agrawal et al. | 326/39 X |
| 5,338,984 | 8/1994 | Sutherland | 326/39 X |
| 5,367,208 | 11/1994 | El Gamal et al. | 326/44 |
| 5,369,314 | 11/1994 | Patel et al. | 326/39 X |
| 5,376,844 | 12/1994 | Pedersen et al. | 326/39 X |

FOREIGN PATENT DOCUMENTS

9107015  5/1991  WIPO .................. H03K 19/173

*Primary Examiner*—David R. Hudspeth
*Attorney, Agent, or Firm*—D'Alessandro & Ritchie

[57] ABSTRACT

A user-programmable gate array architecture includes an array of logic function modules which may comprise one or more combinatorial and/or sequential logic circuits. An interconnect architecture comprising a plurality of horizontal and vertical general interconnect channels, each including a plurality of interconnect conductors some of which may be segmented, is imposed on the array. Individual ones of the interconnect conductors are connectable to each other and to the inputs and outputs of the logic function modules by user-programmable interconnect elements. A local interconnect architecture comprising local interconnect channels is also imposed on the array. Each local interconnect channel includes a plurality of local interconnect conductors and runs between pairs of adjacent ones of the logic function modules.

24 Claims, 9 Drawing Sheets

| Signal Name: | A0 | B0 | A1 | B1 | L0 | L1 | L2 | L3 | D0 | D1 | D2 | D3 | Output Equation |
|---|---|---|---|---|---|---|---|---|---|---|---|---|---|
| Reference Num: | 56 | 58 | 72 | 74 | 78 | 80 | 82 | 84 | 48 | 50 | 60 | 62 | |
| Function | External | | | | | | | | Internal | | | | |
| AND4 | a | b | c | 0 | 0 | 0 | 0 | d | L0 | L1 | L2 | L3 | abcd |
| NAND4 | a | b | c | 0 | 1 | 1 | 1 | d | L0 | L1 | L2 | !L3 | !(abcd) |
| OR4 | a | 1 | b | c | 1 | 1 | 1 | 1 | L0 | L1 | L2 | L3 | a+b+c+d |
| NOR4 | a | 1 | b | c | d | 0 | 0 | 0 | !L3 | L0 | L1 | L2 | !(a+b+c+d) |
| XOR3 | a | 1 | b | 0 | 0 | 0 | 0 | c | L3 | !L3 | L3 | L3 | a!b!c+!ab!c+!a!bc+abc |
| XNOR3 | a | 1 | b | 0 | 0 | 0 | 0 | c | !L3 | L3 | L3 | !L3 | !(a!b!c+!ab!c+!a!bc+abc) |
| RS-Latch | !r | 1 | s | 0 | 0 | q | q | 1 | L0 | L1 | L2 | L3 | q |
| D-Latch | e | 1 | 1 | 1 | 0 | 0 | q | d | L0 | L1 | L2 | L3 | q |
| D-Latch w/Res | e | 1 | !r | 0 | 0 | 0 | q | d | L0 | !L3 | L2 | L3 | q |
| 2-bit Sum | a0 | b0 | a1 | 0 | 0 | 0 | 0 | b1 | L3 | L3 | L3 | L1 | (a0b0)!a1!b1+!(a0b0)a1!b1+!(a0b0)!a1b1+(a0b0)a1b1 |
| 2-bit Carry | a0 | b0 | a1 | 0 | 0 | 1 | 0 | b1 | L0 | L3 | L2 | L3 | (a0b0)a1+(a0b0)b1+a1b1 |
| 4:1 Mux | s0 | 1 | s1 | 0 | d0 | d1 | d2 | d3 | L0 | L1 | L2 | L3 | d0!s1!s0+d1!s1s0+d2s1!s0+d3s1s0 |

FIG. 2B

PROGRAMMABLE LOGIC MODULE AND ARCHITECTURE FOR FIELD PROGRAMMABLE GATE ARRAY DEVICE

RELATED APPLICATION DATA

This application is a continuation-in-part of application Ser. No. 08/002,873, filed Jan. 13, 1993, now U.S. Pat. No. 5,367,208 which is a continuation of application Ser. No. 07/869,488, filed Apr. 15, 1992, now U.S. Pat. No. 5,187,393, which is a continuation of application Ser. No. 07/621,452, filed Jan. 15, 1991, now U.S. Pat. No. 5,172,014, which is a divisional of application Ser. No. 07/309,306, filed Feb. 10, 1989, now U.S. Pat. No. 5,015,885, which is a CIP of Ser. No. 07/195,728, filed May 18, 1988, now U.S. Pat. No. 4,873,459 which is a continuation-in-part of application Ser. No. 06/909,261, filed Sep. 19, 1986, now U.S. Pat. No. 4,758,745.

BACKGROUND OF THE INVENTION

1. Field of the Invention

The present invention relates to programmable integrated circuits. More particularly, the present invention relates to a programmable logic module and architecture for use in integrated circuits such as field programmable gate array integrated circuits.

2. The Prior Art

Recent advances in user-programmable interconnect technology have resulted in the development of field programmable gate array (FPGA) integrated circuits which may be customized by a user to perform a wide variety of combinational and sequential logic functions. Numerous architectures for such integrated circuits are known. Examples of such architectures are found disclosed in U.S. Pat. No. 4,870,302 to Freeman, U.S. Pat. No. 4,758,745 to El Gamal et al., and U.S. Pat. No. 5,132,571 to McCollum et al. The architecture employed in a particular FPGA integrated circuit will determine the richness and the density of the possible interconnections which can be made among the various circuit elements disposed on the integrated circuit and thus can profoundly affect its usefulness.

Programmable logic blocks which are capable of performing a selectable one of a plurality of user-selectable logic functions are known in the prior art and are employed in FPGA architectures such as the ones cited above. U.S. Pat. No. 4,910,417 to El Gamal et al., assigned to the same assignee as the present invention, U.S. Pat. Nos. 5,055,718 and 5,198,705 to Galbraith et al., and U.S. Pat. No. 4,453,096 to Le Can et al., disclose logic modules composed of multiplexers capable of performing a plurality of combinatorial functions. U.S. Pat. No. 4,541,067 to Whittaker discloses how to perform different logic functions using different combinations of pass transistors.

While these circuits provide a degree of flexibility to the designer of user-programmable logic arrays, there is always a need for improvement of functionality of such circuits.

BRIEF DESCRIPTION OF THE INVENTION

The present invention relates to FPGA architectures, and more specifically to the core architecture of an FPGA integrated circuit including the functional circuit modules, sometimes referred to as programmable logic modules, and the interconnect architecture which is used to define the functions of the programmable logic modules as well as the interconnections between them.

A user-programmable gate array architecture according to the present invention includes an array of logic function modules which may comprise one or more combinatorial and/or sequential logic circuits. An interconnect architecture comprising a plurality of horizontal and vertical general interconnect channels, each including a plurality of interconnect conductors some of which may be segmented, is imposed on the array. Individual ones of the interconnect conductors are connectable to each other and to the inputs and outputs of the logic function modules by user-programmable interconnect elements. A local interconnect architecture comprising local interconnect channels is also imposed on the array. Each local interconnect channel includes a plurality of local interconnect conductors and runs between two or more adjacent ones of the logic function modules.

A programmable logic module according to a presently preferred embodiment of the present invention comprises three function units. Each of the three functional units may be selected from among at least a combinatorial unit and a sequential unit.

According to a presently preferred embodiment, the combinatorial unit for the programmable logic module may comprise three multiplexers. A first two input multiplexer has a first data input connected to a first data input node, a second data input connected to a second data input node, a control input connected to the output of a first gate, and an output. The first gate has a first input connected to a first control input node and a second input connected to a second control input node. A second two input multiplexer has a first data input connected to a third data input node, a second data input connected to a fourth data input node, a control input connected to the output of the first gate, and an output. A plurality of interconnect conductors intersect the first through fourth data input nodes and a user-programmable interconnect element is preferably disposed at each intersection to allow programmable connections to be made between selected ones of the interconnect conductors and selected ones of the first through fourth data input nodes. One of the plurality of interconnect conductors is connected to another one of the interconnect conductors through an inverter.

A third two input multiplexer has a first data input connected to the output of the first multiplexer, a second data input connected to the output of the second multiplexer, a control input connected to the output of a second gate, and an output. The output is preferably buffered. The second gate has a first input connected to a third control input node and a second input connected to a fourth control input node.

According to a presently preferred embodiment of the invention, the sequential unit comprises three multiplexers and a D flip-flop, although other sequential logic circuits will also be usable. A first two input multiplexer has a first data input connected to a first data input node, a second data input connected to a second data input node, a control input connected to a first control node, and an output. A second two input multiplexer has a first data input connected to the output of the first multiplexer, a second data input connected to the output of the D flip-flop, a control input connected to a second control node, and an output connected to the D input of the D flip-flop. A first four input multiplexer has a first data input connected to a first clock input node, a second data input connected to the complement of the signal on the first data input node, a third data input connected to a second clock input node, a fourth data input connected to the complement of the signal on the second clock input node, first control input connected to a clock select node and a second control input connected to a clock polarity select node, and an output connected to the clock input of the D flip-flop.

As previously noted, it is presently preferred to combine three functional units into a logic module. These three units may be identical, i.e., the logic module may comprise three combinatorial units or three sequential units, or may be mixed, i.e., the logic module may comprise one combinatorial unit and two sequential units. In logic modules containing mixtures of combinatorial units and sequential units, it may be advantageous to internally connect the prebuffered output of the combinatorial unit to one of the inputs of the first multiplexer of the sequential unit.

In a logic module architecture according to the present invention, two or more logic modules as previously described may be combined with a plurality of local interconnect conductors as previously described. According to a presently preferred embodiment of the invention, the local interconnect conductors are associated with a pair of logic modules. The outputs of the six functional units comprising the pair of logic modules are individually hardwired to different ones of the local interconnect conductors.

Selected ones of the inputs of the six function units comprising the two logic modules are programmably connectable to selected ones of the local interconnect conductors. The interconnect conductors which intersect the input nodes of the multiplexers of the combinatorial units also intersect the local interconnect conductors. User-programmable interconnect elements are disposed at the intersections of the interconnect conductors and the local interconnect conductors to allow selective programmable interconnections to be made therebetween.

In addition, at least one of the inputs of at least one of the first and second gates in the combinatorial units intersects the local interconnect conductors and may be programmably connected to individual ones thereof by user-programmable interconnect elements.

In a presently contemplated embodiment of the invention, an array of logic module pairs according to the present invention is disposed on an integrated circuit. An architecture of interconnect conductors is superimposed on the logic modules. According to a presently preferred embodiment of the invention, groups of general interconnect conductors run in both a horizontal and a vertical direction in proximity to the logic modules. As is known in the prior art, these general interconnect conductors may be segmented by user-programmable interconnect elements. User programmable interconnect elements may be disposed at selected intersections of the horizontal and vertical general interconnect conductors and at the intersections of the vertical general interconnect conductors and the local interconnect conductors. The general interconnect conductors are programmably connected to the data input nodes, control input nodes, and output nodes of the functional units in the logic modules.

BRIEF DESCRIPTION OF THE DRAWINGS

FIG. 2B is a table showing the output states of the combinatorial functional unit of FIG. 2A as a function of the states of the inputs.

DETAILED DESCRIPTION OF A PREFERRED EMBODIMENT

Those of ordinary skill in the art will realize that the following description of the present invention is illustrative only and not in any way limiting. Other embodiments of the invention will readily suggest themselves to such skilled persons.

Figure 1:
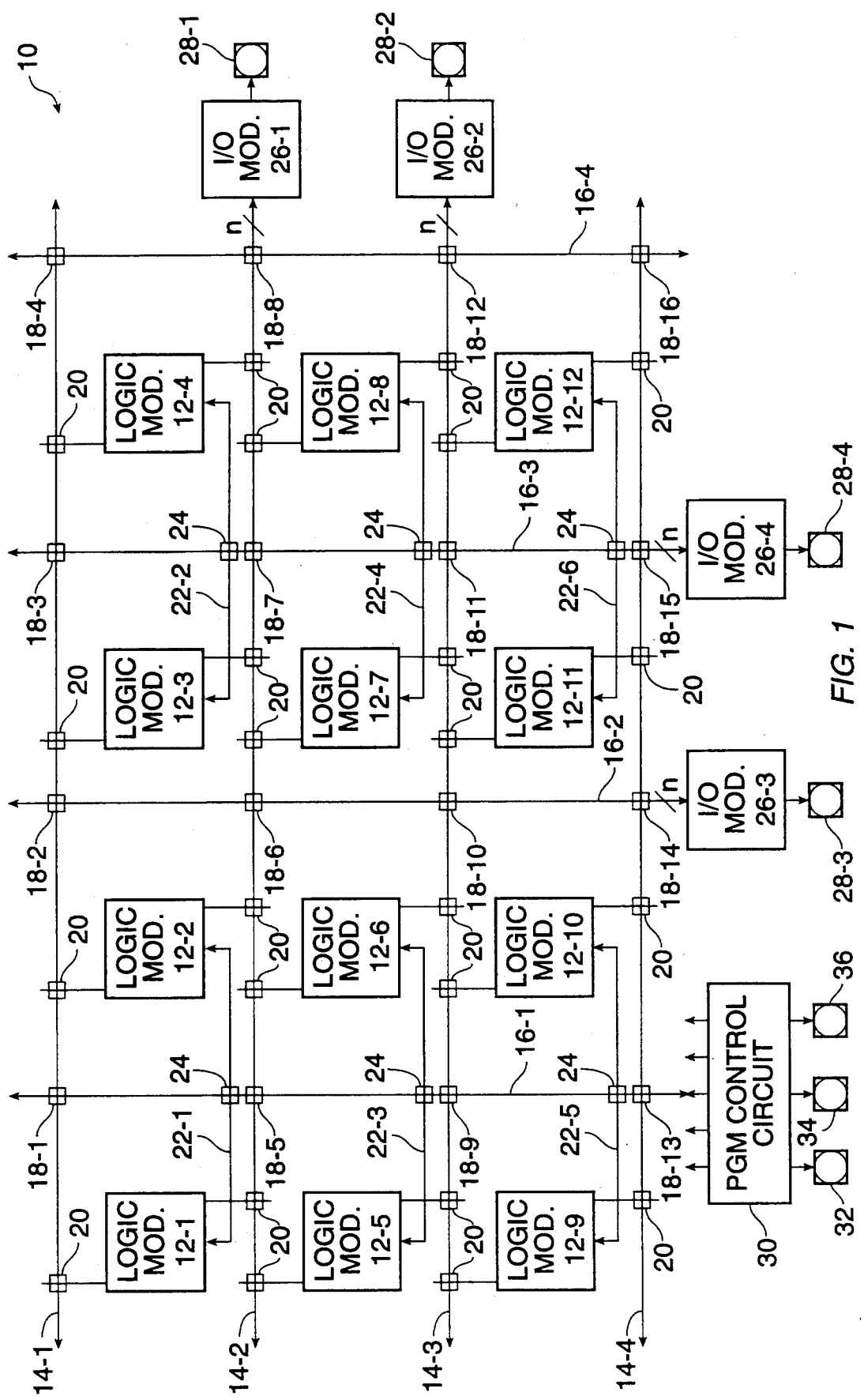
FIG. 1 is a simplified block diagram of a core architecture according to the present invention which may be employed in an FPGA integrated circuit.

Referring first to FIG. 1, a simplified block diagram of an FPGA core architecture 10 according to the present invention is shown. As used herein the term "core architecture" refers to the architecture of the core of an FPGA array which comprises a plurality of logic function circuits or modules (reference numerals 12-1 to 12-12) arranged in a matrix with an overlay of interconnect architecture including interconnect conductors and user-programmable interconnect elements. The logic function modules 12-1 through 12-12 may comprise any of a variety of circuits, either combinational logic, sequential logic, or combinations thereof, and need not be identical, as will be disclosed in more detail herein with respect to a presently preferred embodiment of the invention.

As shown in FIG. 1, logic function modules 12-1 through 12-12 are disposed in a network of interconnect conductors. In order to avoid overcomplicating the figure and rendering it more difficult to comprehend, those of ordinary skill in the art will recognize that the network of interconnect conductors is shown in simplified schematic form. In addition, while the drawing shows the interconnect conductors running between the logic function circuits, those of ordinary skill in the art will readily recognize that the architecture may be a "sea of gates" type architecture where the interconnect conductors actually run directly over, rather than between, the logic function circuits. In virtually all cases, the interconnect conductors will comprise metal lines in layers disposed over the layers which constitute the logic function circuits.

Such a "sea of gates" architecture is known in the art and is exemplified by U.S. Pat. No. 5,132,571 to McCollum et al. and permits the fabrication of a more dense array than an architecture in which the interconnect conductors run only between the logic function circuits. While such a "sea of gates" arrangement is preferred, those of ordinary skill in the art will recognize that the principles of the present invention apply equally to both types of architectures as well as hybrid architectures having interconnect conductors both directly above and between the logic function circuits.

FIG. 1 depicts an interconnect architecture comprising a plurality of horizontal and vertical channels of interconnect conductors. For simplicity, horizontal channels are depicted as single lines identified by reference numerals 14-1, 14-2, 14-3, and 14-4, and vertical channels are depicted as single lines identified by reference numerals 16-1, 16-2, 16-3, and 16-4. Those of ordinary skill in the art will appreciate that each channel will comprise a plurality of individual interconnect conductors, some of which may be segmented and some of which may run the length (or width) of the array. The number of interconnect conductors present in each channel in any actual integrated circuit which embodies the present invention will be dictated by individual design choice, based upon such factors as array size and density.

The segmentation of interconnect conductors is known and is exemplified in prior art patents such as U.S. Pat. No. 4,758,745 to El Gamal et al. and U.S. Pat. No. 5,073,729 to Greene et al. and is thus not shown in FIG. 1 to avoid overcomplicating the figure. As will be appreciated by those of ordinary skill in the art, any one of the many available segmentation schemes may be employed in the architecture of the present invention. Such skilled persons will recognize that the segmented interconnect conductors may be selectively joined to make longer conductors by programming user-programmable interconnect elements between selected ones of the conductors.

In order to provide for a rich potential of interconnection choices, the intersections of selected ones of the individual conductors horizontal and vertical interconnect channels are populated with user programmable interconnect elements which may be programmed by the user to make electrical connections between selected ones of them to implement connection nets between the inputs and the outputs of the logic function circuits. Groups of such user programmable interconnect elements at the intersections of the horizontal and vertical interconnect channels are shown schematically in FIG. 1 as squares 18-1 through 18-16. Inputs and outputs of the logic function circuits are also connectable to selected ones of the interconnect conductors in the channels by user-programmable interconnect elements disposed at the intersections of the individual inputs and outputs and selected ones of the interconnect conductors in the channels, as shown schematically by squares 20.

There are a number of available user-programmable interconnect technologies which may be employed in the architecture of the present invention. These include such elements as antifuses and active devices, such as pass transistors. Such devices, their implementation, and the circuitry necessary to program them, are well known to those of ordinary skill in the art. The details of these known devices will not be set forth herein to avoid overcomplicating the disclosure and thus obscuring the nature of the present invention. For convenience, the present disclosure will employ antifuse elements as exemplary user-programmable interconnect elements, but those of ordinary skill in the art will recognize that the present invention is not limited thereto and is intended to encompass pass transistors and other known devices which are user-programmable element equivalents of antifuses.

An important feature of the present invention is a network of "local interconnect" channels which are shown running between adjacent pairs of logic function circuits in the matrix. In FIG. 1, these local interconnect channels are shown running between 12-1 and 12-2, 12-3 and 12-4, 12-5 and 12-6, 12-7 and 12-8, 12-9 and 12-10, 12-11 and 12-22, and are indicated by reference numerals 22-1 through 22-6. As will be disclosed in more detail herein, the local interconnect channels provide an enhanced interconnection capability between neighboring logic function circuits. Those of ordinary skill in the art will recognize that the local interconnect channels may connect more than a single pair of adjacent logic modules. As a non-limiting example, local interconnect channel 22-1 could also be used in conjunction with the general interconnect channels to make connections to logic modules 12-5 and 12-6 as will be seen more clearly from FIG. 2A.

According to a presently preferred embodiment of the invention, selected ones of the individual local interconnect conductors are connectable to selected ones of the interconnect conductors in the channels by user-programmable interconnect elements placed at intersections thereof. The networks of these user-programmable interconnect elements are shown schematically in FIG. 1 as squares 24.

The core architecture of FPGA 10 communicates off chip by means of a plurality of input/output (I/O) modules. Illustrative I/O modules 26-1, 26-2, 26-3, and 26-4 are shown coupled between I/O pads 28-1, 28-2, 28-3, and 28-4, respectively, and horizontal interconnect channels 14-2 and 14-3 and vertical interconnect channels 16-2 and 16-3 respectively. As will be appreciated by those of ordinary skill in the art, I/O modules 26-1, 26-2, 26-3, and 26-4 each comprise an input buffer, an output buffer and input/output function select circuitry. The design of particular I/O module circuitry is simply a matter of design choice and is well within the level of ordinary skill in the art. Known examples of such circuitry may be found in U.S. Pat. No. 5,083,083.

Programming of the FPGA 10 of the present invention is controlled by program and test control circuit 30. Program and test control circuit 30 contains the necessary circuitry to accept programming data and control signals from off chip via I/O pads 32, 34, and 36. Those of ordinary skill in the art will recognize that the number of such I/O pads necessary for any actual implementation of the present invention will vary according to design choice and requirements. The data and control signals are used to program selected ones of the user-programmable interconnect elements in the integrated circuit in order to define the circuit functions of the logic function modules 12-1 through 12-12 and the I/O modules 26-1 through 26-4 and the circuit connection paths between them. Program and test control circuit 30 may also be used to provide test data to and obtain test data from the logic function modules 12-1 through 12-12 as known in the art. Examples of testing using such circuitry are found in U.S. Pat. Nos. 4,758,745 and 5,083,083.

Figure 2A:
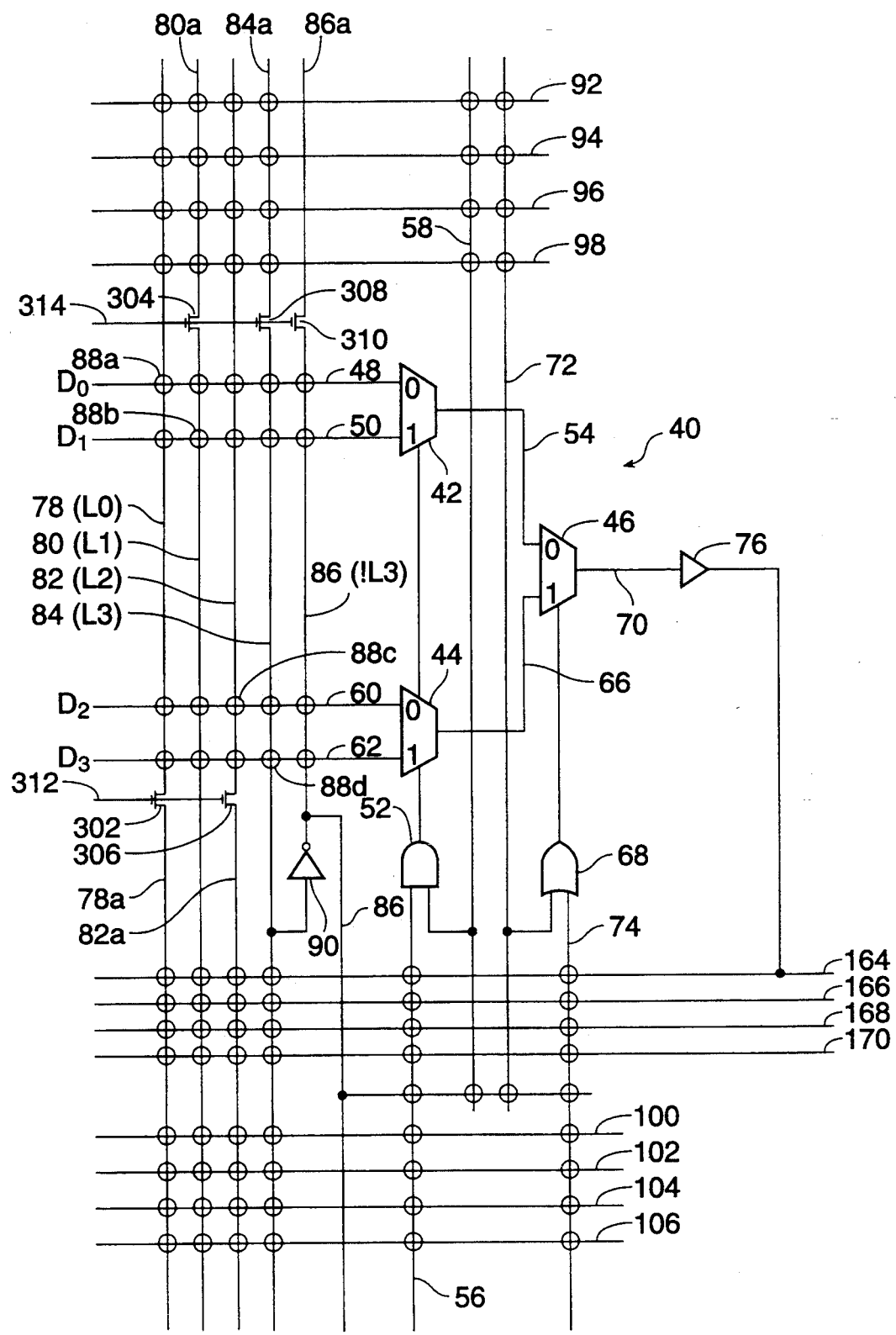
FIG. 2A is a block/schematic diagram of a presently preferred combinational functional unit according to the present invention, showing a portion of the interconnection architecture of the present invention.

As previously disclosed, the individual logic module circuits used in the present invention may comprise combinatorial logic units, sequential logic units, or combinations of one or both kinds of logic units. Referring now to FIG. 2A, a schematic/block diagram, a presently preferred embodiment of combinatorial unit 40 for the programmable logic module may comprise three two-input multiplexers 42, 44, and 46. First two-input multiplexer 42 has a first data input connected to a first data input node 48, a second data input connected to a second data input node 50, a control input connected to the output of a first gate 52, and an output 54. The first gate 52 has a first input connected to a first control input node 56 and a second input connected to a second control input node 58. Second two-input multiplexer 44 has a first data input connected to a third data input node 60, a second data input connected to a fourth data input node 62, a control input connected to the output of the first gate 52, and an output 66. Third two-input multiplexer 46 has a first data input connected to the output 54 of first multiplexer 42, a second data input connected to the output 66 of second multiplexer 44, a control input connected to the output of a second gate 68, and an output 70. The second gate 68 has a first input connected to a third control input node 72 and a second input connected to a fourth control input node 74. An output buffer 76 is connected to the output 70 of third multiplexer 46. First gate 52 and second gate 68 are shown as an AND and an OR gate, respectively, but persons of ordinary skill in the art will recognize that other gate combinations are possible.

A plurality of interconnect conductors 78, 80, 82, 84, and 86 intersect the first through fourth data input nodes 48, 50, 60 and 62 and user-programmable interconnect elements (shown as hollow circles in the drawing figures) are preferably disposed at each intersection to allow programmable connections to be made between selected ones of the interconnect conductors and selected ones of the first through fourth data input nodes. Selected ones of the user-programmable interconnect elements are indicated by reference numerals 88a–88d and will be discussed later with reference to FIG. 2B.

One of the plurality of interconnect conductors 86 is connected to another one of the interconnect conductors 84 through an inverter 90. As will be appreciated by those of ordinary skill in the art, the presence of inverter 90 adds to the versatility of the logic function module circuits by allowing a selected one of the input terms to be inverted. This versatility could be further increased by extending interconnect conductor 86 to cross other functional unit inputs in the same functional unit or by making it a part of the local interconnect channel to allow connections to other functional units. The output of inverter 90 can also be connected to any of the inputs of gates 52 and 68 through additional antifuses.

As may also be seen from FIG. 2A, the interconnect conductors 78, 80, 82, and 84 are shown intersecting horizontal interconnect conductors 92, 94, 96, and 98 in an upper general interconnect channel and horizontal interconnect conductors 100, 102, 104, and 106 in a lower general interconnect channel. The control input nodes 56, 58, 72, and 74 of the first and second gates 52 and 68 also cross the horizontal interconnect conductors 92, 94, 96, 98, 100, 102, 104, and 106. Other user-programmable interconnect elements are disposed at the intersections of these conductors and may be programmed to selectively make connections as is known in the art.

Those of ordinary skill in the art will recognize that the particular arrangement depicted in FIG. 2A is merely illustrative and that other arrangements using other numbers of interconnect conductors and other schemes for populating the conductor intersections with user-programmable interconnect elements are possible.

The combinatorial unit 40 for the programmable logic module depicted in FIG. 2A is a compact and flexible circuit, capable of performing a wide variety of combinatorial logic functions. Referring now to FIG. 2B, a table is presented showing the output states of the combinatorial logic function module block of FIG. 2A as a function of the states of its inputs for a small sampling of the available combinatorial functions possible using this unit. Those of ordinary skill in the art will be readily able to determine the remaining possible functions. Such skilled persons will also readily recognize that multiple implementations are possible for certain of these functions. In reading the Table of FIG. 2B, A0 and B0 represent the first and second control inputs 56 and 58 of AND Gate 52, A1 and B1 represent the first and second control inputs 72 and 74 of OR Gate 68. The input lines L0, L1, L2, and L3 represent interconnect conductors 78, 80, 82, and 84, respectively. The inputs D0, D1, D2, and D3 represent the data input nodes 48, 50, 60 and 62, respectively, of the first and second multiplexers 42 and 44. Finally, the notation !L3 in the entries under "Internal" represent the output of inverter 90 on interconnect conductor 86. By reading the entries under L0, L1, L2, and L3 together with the entries under D0, D1, D2, and D3, those of ordinary skill in the art can readily determine which user-programmable interconnect elements to program to implement the desired logic function.

The entries in FIG. 2B are straightforward. As an example, to configure the programmable logic module depicted in FIG. 2A as a four-input AND Gate, the following connections are made. The input terms "a" and "b" are presented to the first and second inputs of AND gate 52 on lines 56 and 58. The input term "c" is presented to one of the inputs 72 of OR gate 68 and a logic "0" is presented to the other input 74 of OR gate 68. Logic "0" levels are presented to interconnect conductors 78, 80, and 82, and the input term "d" is presented to interconnect conductor 84.

By examining the entries in the first line of the table of FIG. 2B it is seen that D0 (first data input node 48 to first input of first multiplexer 42) is connected to interconnect conductor 78. This may be accomplished by programming user-programmable interconnect element 88a at the intersection of interconnect conductor 78 and first data input node 48. Similarly, D1 (second data input node 50 to second input of first multiplexer 42) is connected to interconnect conductor 80. This may be accomplished by programming user-programmable interconnect element 88b at the intersection of interconnect conductor 80 and second data input node 50. Similarly, D2 (third data input node 60 to first input of second multiplexer 44) is connected to interconnect conductor 82. This may be accomplished by programming user-programmable interconnect element 88c at the intersection of interconnect conductor 82 and third data input node 60. Similarly, D3 (fourth data input node 62 to second input of second multiplexer 44) is connected to the input term "d" on interconnect conductor 84.

This connection is made by programming user-programmable interconnect element 88d at the intersection of interconnect conductor 84 and fourth data input node 62.

Figure 2C:
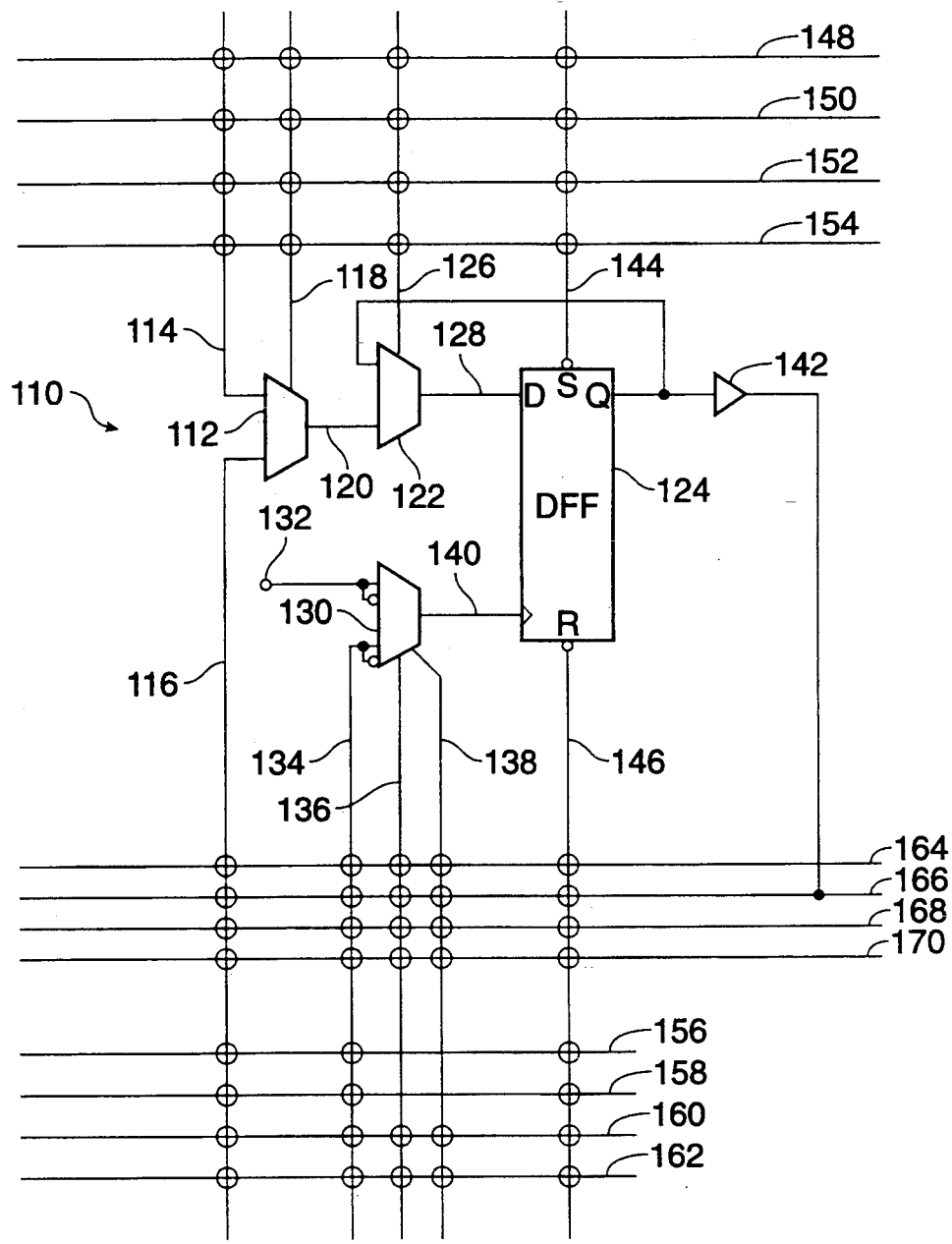
FIG. 2C is a block/schematic diagram of a presently preferred sequential functional unit according to the present invention, showing a portion of the interconnection architecture of the present invention.
Figure 3A:
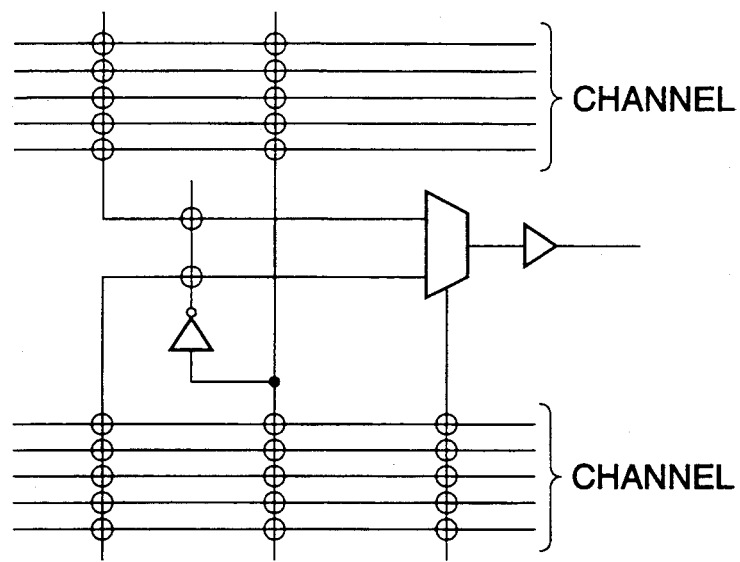
FIGS. 3A-3F are block/schematic diagrams of other exemplary combinational functional units which may be employed in FPGA architectures according to the present invention.
Figure 3B:
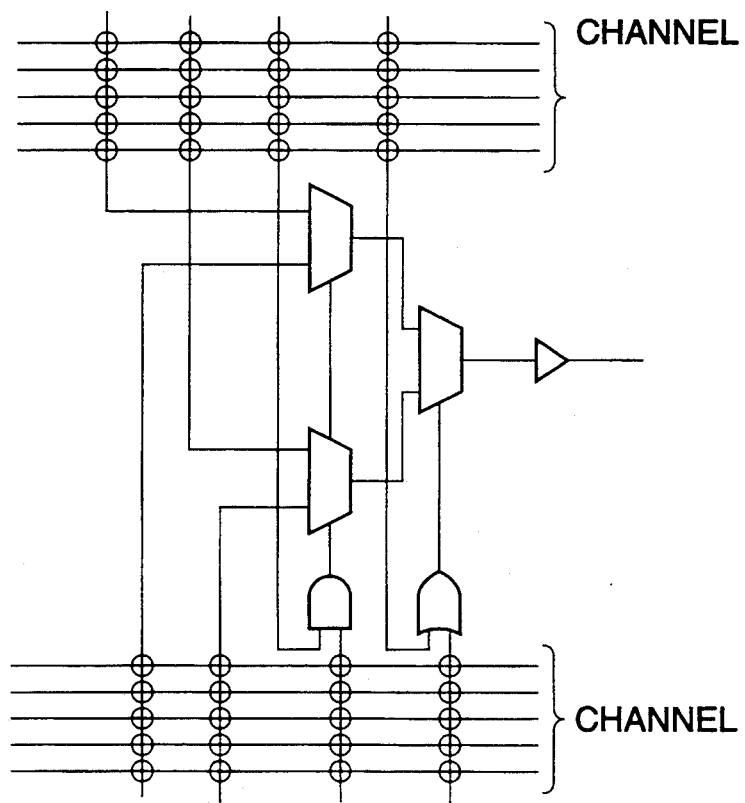
Figure 3C:
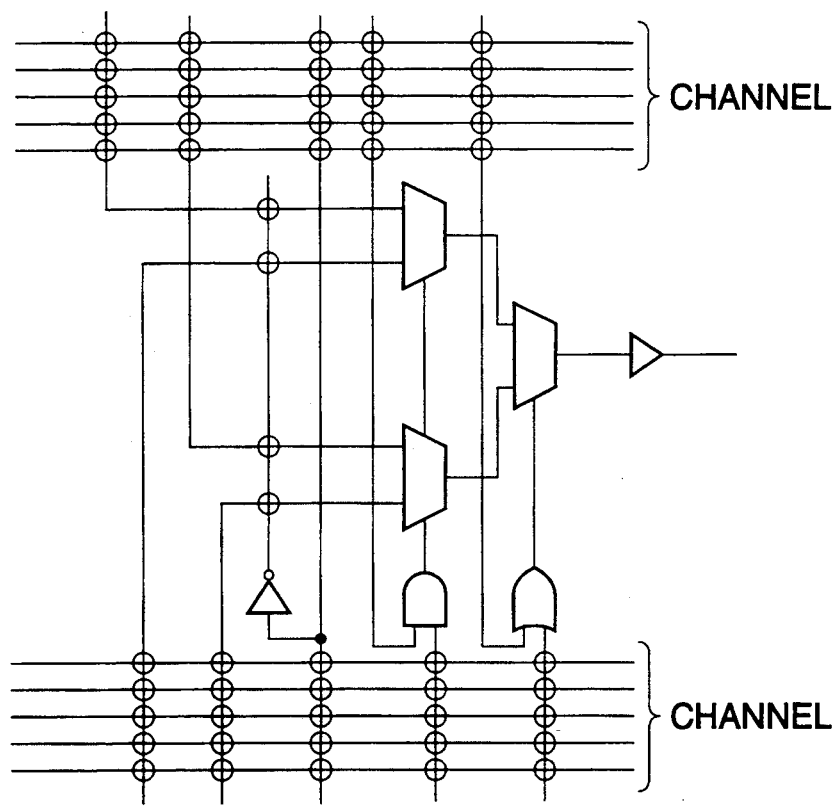
Figure 3D:
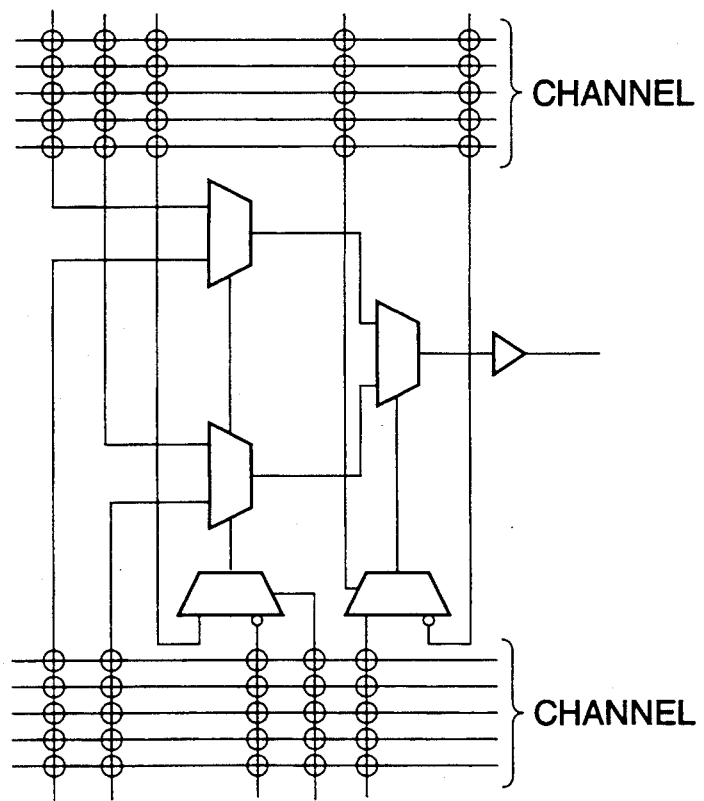
Figure 3E:
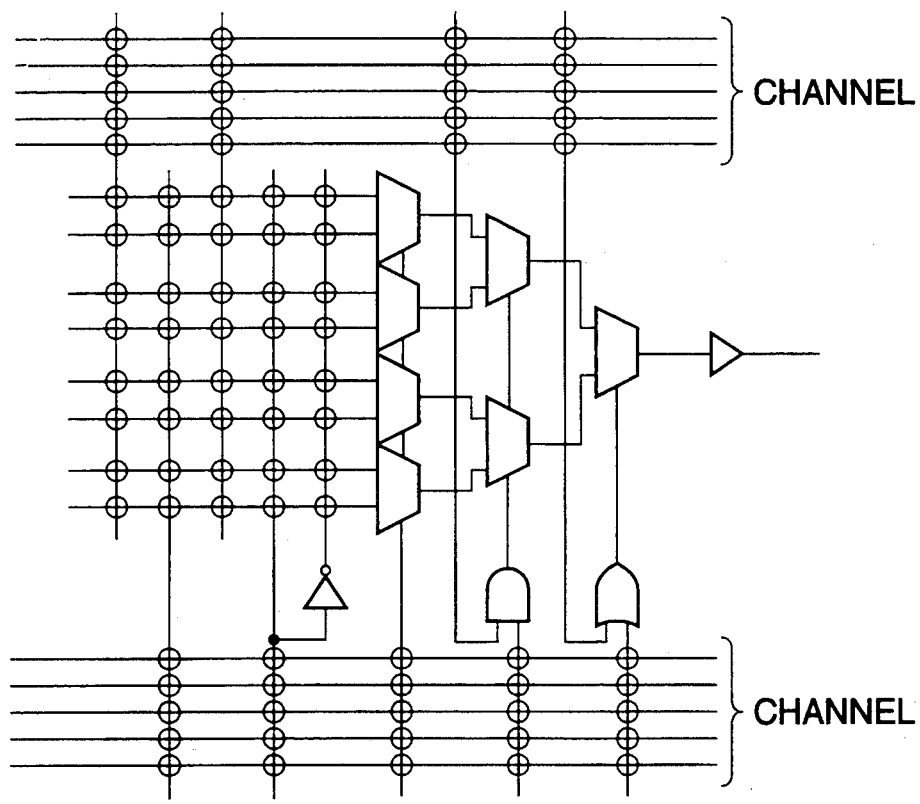
Figure 3F:
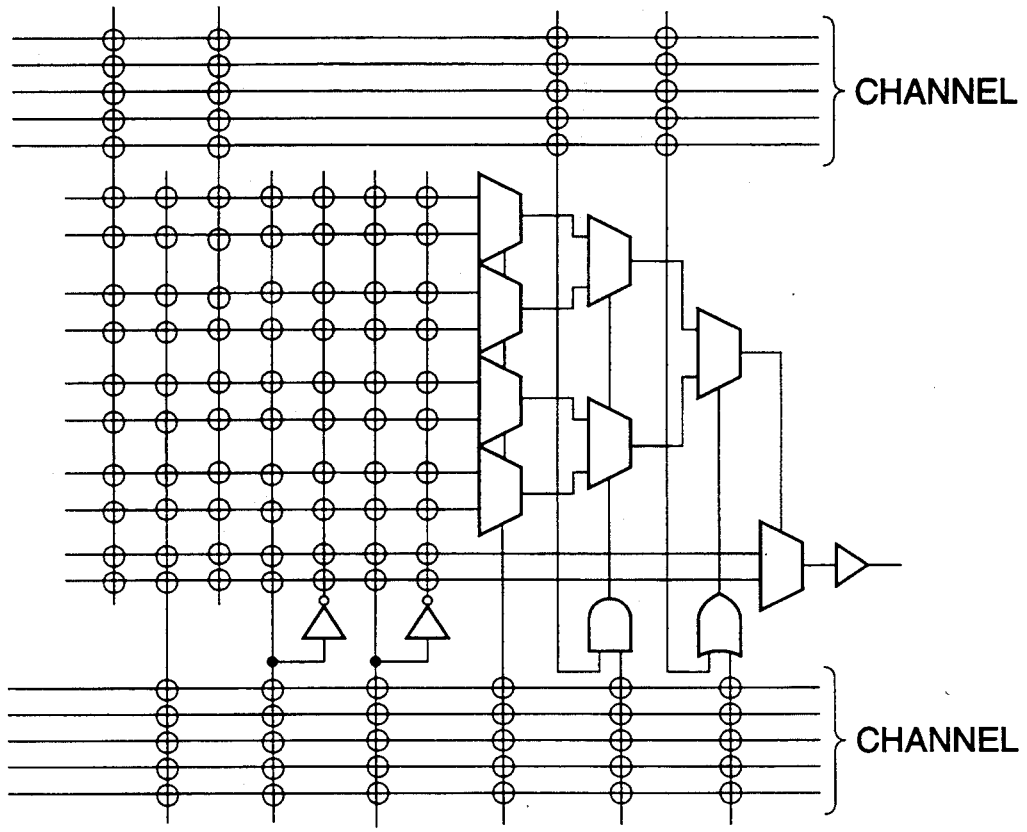

Referring now to FIG. 2C, a presently preferred embodiment of a sequential logic unit 110 for a logic module according to the present invention is shown in block/schematic format. According to a presently preferred embodiment of the invention, the sequential logic unit comprises three multiplexers and a D flip-flop. A first two-input multiplexer 112 has a first data input connected to a first data input node 114, a second data input connected to a second data input node 116, a control input connected to a first control node 118, and an output 120. A second two-input multiplexer 122 has a first data input connected to the output 120 of the first multiplexer, a second data input connected to the output of D flip-flop 124, a control input connected to a second control node 126, and an output 128 connected to the D input of the D flip-flop 124. A first four-input multiplexer 130 has a first data input connected to a first clock input node 132, a second data input connected to the complement of the signal on first clock input node 132, a third data input connected to a second clock input at node 134, a fourth data input connected to the complement of the second clock input signal on node 134, a first control input connected to a clock select node 136, a second control input connected to a clock polarity select node 138, and an output 140 connected to the clock input of the D flip-flop 124. The output of D flip-flop 124 is buffered by buffer 142. Finally, D flip-flop 124 is also provided with set and reset inputs connected to set and rest nodes 144 and 146, respectively.

As with the combinatorial unit 40 of FIG. 2A, sequential unit 110 of FIG. 2C is connectable to the interconnect architecture of the present invention. As may also be seen from FIG. 2C, the various inputs and control inputs of the elements of sequential unit 110 are shown intersecting horizontal interconnect conductors 148, 150, 152, and 154, in an upper general interconnect channel and horizontal interconnect conductors 156, 158, 160, and 162 in a lower general interconnect channel. User-programmable interconnect elements are disposed at the intersections of these conductors and may be programmed to selectively make connections as is known in the art.

Those of ordinary skill in the art will appreciate that sequential unit 110 is also a flexible circuit. First four-input multiplexer 130 is used to select and control the clock source so that the D flip-flop 124 can be driven from a system clock at first clock input node 132, which would preferably be common to all such units on an integrated circuit, or a clock signal from a clock node derived from other signals presented on second clock node 134 from the general interconnect channels. The connection of clock polarity select control node 138 to first four-input multiplexer 130 allows selection of rising or falling edge triggering for the D flip-flop 124. As will be readily appreciated by those of ordinary skill in the art, this function is also easily implemented by a third two-input multiplexer and an exclusive-OR gate.

Referring again to FIGS. 2A and 2C, another set of interconnect conductors is provided for connection to the inputs and outputs of both combinatorial and sequential units 40 and 110. Unlike the general interconnect channels represented by interconnect conductors 92, 94, 96, 98, 100, 102, 104, 106, 148, 150, 152, 154, 156, 158, 160, and 162, these interconnect conductors are local interconnect shared between neighboring logic modules. Also, unlike the general interconnect conductors, the outputs of the combinatorial unit 40 and the sequential unit 110 are hardwired to individual ones of the local interconnect conductors.

The local interconnect conductors are given the same reference numerals in FIGS. 2A and 2C. In the illustrative embodiments depicted in FIGS. 2A and 2C, four local interconnect conductors 164, 166, 168, and 170 are shown, although those of ordinary skill in the art will recognize that the number of local interconnect conductors to be used in any actual realization of the architecture of the present invention will be largely a matter of design choice and the number of combinational and sequential units in the locally interconnected logic modules.

The output of buffer 76 of combinatorial unit 40 is shown hardwired to local interconnect conductor 164. Similarly, the output of buffer 142 of sequential unit 110 is shown hardwired to local interconnect conductor 166. Selected ones of the other data and control inputs of combinatorial unit 40 and sequential unit 110 are shown connectable to local interconnect conductors 164, 166, 168, and 170 via user-programmable interconnect elements shown as circles at the intersections of the data and control inputs of combinatorial unit 40 and sequential unit 110 and local interconnect conductors 164, 166, 168, and 170.

While it is presently preferred to employ the combinatorial unit 40 of FIG. 2A in the present invention, those of ordinary skill in the art will appreciate that other combinatorial units will be usefully employed in the architecture of the present invention. Referring now to FIGS. 3A–3F, alternative combinatorial unit circuits are presented.

As previously noted, it is presently preferred to combine three functional units into a logic module. These three units may be identical, i.e., the logic module may comprise three combinatorial units or three sequential units, or may be mixed, i.e., the logic module may comprise one combinatorial unit and two sequential units. In logic modules containing mixtures of combinatorial units and sequential units, it may be advantageous to internally connect the prebuffered output of the combinatorial unit to one of the inputs of the first multiplexer of the sequential unit. Such an arrangement is shown in FIG. 4A.

Figure 4A:
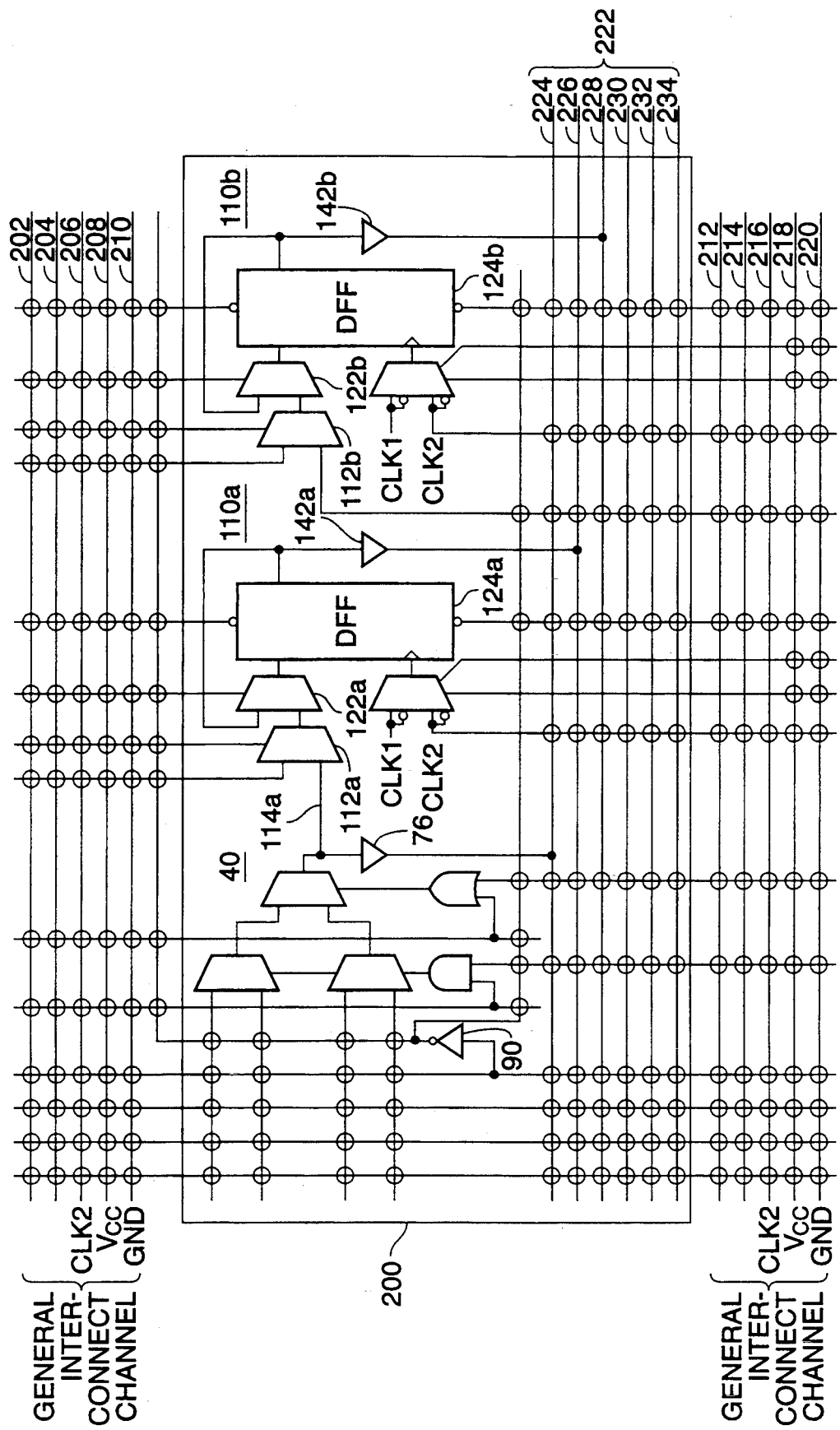
FIG. 4A is a block/schematic diagram of one presently preferred logic module according to the present invention comprising a combination of the functional units of FIGS. 2A and 2C.

Referring now to FIG. 4A, logic function module 200 is depicted in block/schematic format. In the illustrative embodiment of FIG. 4A, logic function module 200 is shown to include a combinatorial unit 40 and two sequential units 110a and 110b. For convenience, the elements of these units depicted in FIG. 4A will be referred to using the same reference numerals used in FIGS. 2A and 2C, although not all elements are numbered in FIG. 4A to avoid overcrowding the drawing.

An upper general interconnect channel includes general interconnect conductors 202, 204, 206, 208, and 210, some of which may be dedicated to clock signal and dedicated logic level functions, and a lower general interconnect channel includes general interconnect conductors 212, 214, 216, 218, and 220, some of which may also be dedicated to clock signal and dedicated logic level functions. A local interconnect channel 222 includes local interconnect conductors 224, 226, 228, 230, 232 and 234. The output of output buffer 76 of combinatorial unit 40 is shown hardwired to local interconnect conductor 224. The output of output buffer 142a of combinatorial unit 110a is shown hardwired to local interconnect conductor 226. The output of output buffer 142b of combinatorial unit 110b is shown hardwired to local interconnect conductor 228. In addition, an internal hardwired connection is shown made between the pre-buffered output of combinatorial unit 40 and the first input 114a of multiplexer 112a in sequential unit 110a. Alternatively, the pre-buffered output of combinatorial unit 40 can be hardwired to the control input of multiplexer 112a.

Those of ordinary skill in the art will appreciate that the logic function module of FIG. 4A is extremely flexible and permits implementation of a wide variety of combinatorial and sequential logic functions. When a plurality of these logic function modules 200 are placed in an array as depicted in FIG. 1, the advantage of the local interconnect channel becomes apparent. In such an arrangement, the outputs of the combinatorial and sequential elements are individually hardwired to different ones of local interconnect conductors 224, 226, 228, 230, 232, and 234. Because the hardwired connections bypass any user-programmable interconnect elements in the general interconnect channels, any time delay which such interconnect elements will normally introduce to signals passing through them are eliminated, resulting in a circuit which is, in effect, a larger, faster, single logic function module.

FIG. 4A also illustrates the extra versatility which the addition of inverter 90 of FIG. 2A adds to the logic module function. As shown in FIG. 4A, the inverter 90 shown physically located in the combinatorial unit 40 may be used with the combinatorial unit 40 or with either sequential unit 110a and 110b by programming appropriate antifuses to connect its output to the data inputs and control inputs of the data multiplexers 112a, and 122a associated with sequential unit 110a and 112b and 122b associated with sequential unit 110b and to the set and reset inputs of the D flip-flops 124a and 124b in the sequential units 110a and 110b, respectively.

According to yet another aspect of the present invention, the mixture and placement of the combinatorial and sequential components of pairs of logic function may be advantageously varied. This aspect of the invention is illustrated in FIGS. 4B-4D, schematic representations of the layouts of logic function module pairs connected by local interconnect channels according to the present invention.

Figure 4B:
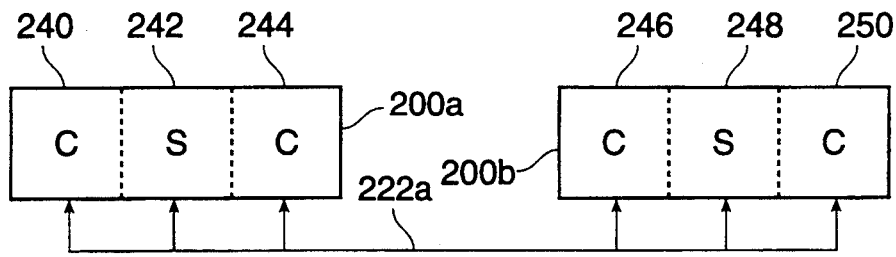
FIGS. 4B-4D are schematic representations of layout arrangements for logic function units within logic modules connected by local interconnect channels according to the present invention.

Referring first to FIG. 4B, a logic function module pair comprising logic function modules 200a and 200b are shown connected by local interconnect bus 222a. Logic function module 200a comprises a leftmost combinatorial unit 240, a center sequential unit 242, and a rightmost combinatorial unit 244. Logic function module 200b comprises a leftmost combinatorial unit 246, a center sequential unit 248, and a rightmost combinatorial unit 250.

Those of ordinary skill in the art will recognize that the outputs of the combinatorial and sequential units 240, 242, 244, 246, 248, and 250 are hardwired to different individual local interconnect conductors of local interconnect channel 222a in the manner depicted in FIG. 4A for a single logic function unit 200.

Figure 4C:
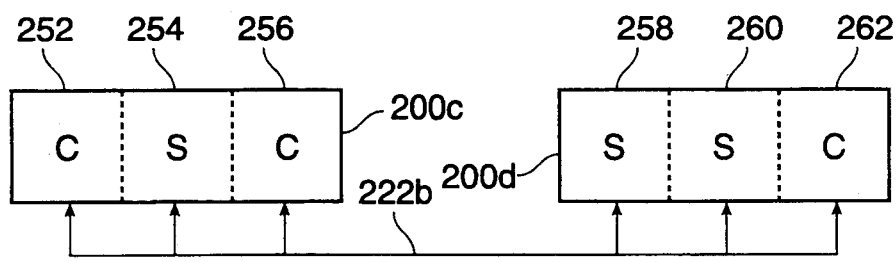
Figure 4D:
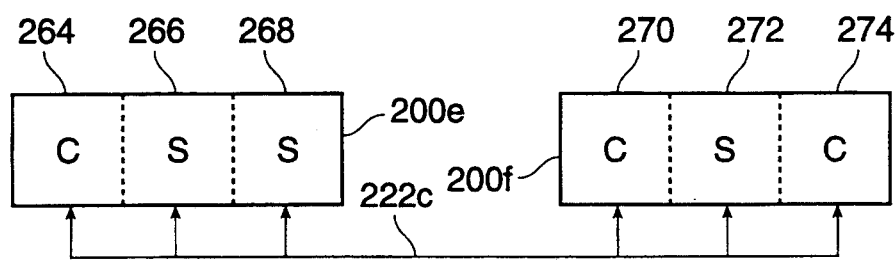

Other variations of the logic module pair layout according to the present invention are shown in FIGS. 4C and 4D. In FIG. 4C, a logic function module pair comprising logic function modules 200c and 200d are shown connected by local interconnect bus 222b. Logic function module 200c comprises a leftmost combinatorial unit 252, a center sequential unit 254, and a rightmost combinatorial unit 256. Logic function module 200d comprises a leftmost sequential unit 258, a center sequential unit 260, and a rightmost combinatorial unit 262. In FIG. 4D, a logic function module pair comprising logic function modules 200e and 200f are shown connected by local interconnect bus 222c. Logic function module 200e comprises a leftmost combinatorial unit 264, a center sequential unit 266, and a rightmost sequential unit 268. Logic function module 200f comprises a leftmost combinatorial unit 270, a center sequential unit 272, and a rightmost combinatorial unit 274.

According to another aspect of the present invention, the interconnect conductors of the interconnect architecture of the present invention may be supplied as segments. The ability to temporarily connect the segments together for purposes such as testing may be provided. Further, user-programmable interconnect elements may be provided to programmably connect the segments together to produce longer interconnect conductors during normal operation of the integrated circuit.

Referring again to FIG. 2A, each of interconnect conductors 78, 80, 82, 84, and 86 are divided into segments by pass transistors. Thus, interconnect conductor 78 is connected to one of the source/drain terminals of pass transistor 302. The other source/drain terminal of pass transistor 302 is connected to interconnect conductor 78a, which may be considered as a downwardly extending vertical extension of interconnect conductor 78. In similar fashion, interconnect conductor 80 is connected to one of the source/drain terminals of pass transistor 304. The other source/drain terminal of pass transistor 304 is connected to interconnect conductor 80a, which may be considered as an upwardly extending vertical extension of interconnect conductor 80. Interconnect conductor 82 is connected to one of the source/drain terminals of pass transistor 306. The other source/drain terminal of pass transistor 306 is connected to interconnect conductor 82a, which may be considered as a downwardly extending vertical extension of interconnect conductor 82. Interconnect conductor 84 is connected to one of the source/drain terminals of pass transistor 308. The other source/drain terminal of pass transistor 308 is connected to interconnect conductor 84a, which may be considered as an upwardly extending vertical extension of interconnect conductor 84. Interconnect conductor 86 is connected to one of the source/drain terminals of pass transistor 310. The other source/drain terminal of pass transistor 310 is connected to interconnect conductor 86a, which may be considered as an upwardly extending vertical extension of interconnect conductor 86.

As shown in FIG. 2A, the locations of the pass transistors are preferably staggered to add to the versatility of the interconnect architecture. Thus pass transistors 302 and 306 are located at one vertical position on their associated interconnect conductors while pass transistors 304, 308, and 310 are located at another vertical position on their associated interconnect conductors. The gates of the pass transistors are driven by the program and test control circuit 30 (FIG. 1). While the gates of pass transistors 302 and 306 are shown connected to a common gate line 312 and the gates of pass transistors 304, 308, and 310 are shown connected to a common gate line 314, those of ordinary skill in the art will recognize that other arrangements are possible.

Those of ordinary skill in the art will appreciate that interconnect conductors 78a and 82a will be connectable through user-programmable interconnect elements to the logic function module (not shown in FIG. 2A) located below logic module in the integrated circuit array and that interconnect conductors 80a, 84a, and 86a will be connectable through user-programmable interconnect elements to the logic function module (not shown in FIG. 2A) located above logic module in the integrated circuit array. The particular segmentation scheme used in an actual architecture fabricated according to the present invention will be somewhat arbitrary and largely a matter of design choice dictated by the particular architectural layout.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A core architecture for a user-programmable gate array integrated circuit, including:
   an array of logic function modules, each of said modules having at least one input and at least one output;
   a general interconnect architecture imposed on said array, said general interconnect architecture comprising a plurality of horizontal and vertical general interconnect channels, each of said horizontal and vertical general interconnect channels including a plurality of interconnect conductors, individual ones of said general interconnect conductors connectable to each other and to the inputs and outputs of the logic function modules by user-programmable interconnect elements; and
   a local interconnect architecture imposed on said array, said local interconnect architecture comprising local interconnect channels, each local interconnect channel running between at least two adjacent ones of said logic function modules and including a plurality of local interconnect conductors, first ones of said local interconnect conductors hardwired to the outputs of said adjacent ones of said logic function modules, and second ones of said local interconnect conductors connectable to each other and to the inputs of the logic function modules by user-programmable interconnect elements.

2. The core architecture of claim 1, wherein said local interconnect channel runs between a pair of said adjacent ones of said logic function modules.

3. The core architecture of claim 1 wherein each of said logic function modules includes a plurality of function units selected from combinatorial units and sequential units.

4. The core architecture of claim 1 wherein said user-programmable interconnect elements are antifuses.

5. The core architecture of claim 3, wherein a first logic function module connected to an individual local interconnect channel comprises a leftmost combinatorial unit, a center sequential unit, and a rightmost combinatorial unit, and wherein a second logic function module connected to said individual local interconnect channel comprises a leftmost combinatorial unit, a center sequential unit, and a rightmost combinatorial unit.

6. The core architecture of claim 3, wherein a first logic function module connected to an individual local interconnect channel comprises a leftmost combinatorial unit, a center sequential unit, and a rightmost combinatorial unit, and wherein a second logic function module connected to said individual local interconnect channel comprises a leftmost sequential unit, a center sequential unit, and a rightmost combinatorial unit.

7. The core architecture of claim 3, wherein a first logic function module connected to an individual local interconnect channel comprises a leftmost combinatorial unit, a center sequential unit, and a rightmost sequential unit, and wherein a second logic function module connected to said individual local interconnect channel comprises a leftmost combinatorial unit, a center sequential unit, and a rightmost combinatorial unit.

8. A combinatorial logic unit comprising:
   a first multiplexer having a first data input connected to a first data input conductor, a second data input connected to a second data input conductor, a control input, and an output;
   a second multiplexer having a first data input connected to a third data input conductor, a second data input connected to a fourth data input conductor, a control input, and an output;
   a third multiplexer having a first data input connected to the output of said first multiplexer, a second data input connected to the output of said second multiplexer, a control input, and an output;
   a first logic gate having a first input connected to a fifth data input conductor, a second input connected to a sixth data input conductor and an output connected to the control inputs of said first and second multiplexers;
   a second logic gate having a first input connected to a seventh data input conductor, a second input connected to an eighth data input conductor and an output connected to the control input of said third multiplexer;
   an output buffer having an input connected to said output of said third multiplexer and an output connected to an output conductor;
   a plurality of interconnect conductors intersecting said data and control input conductors of said first, second, and third multiplexers, said plurality of interconnect conductors selectively connectable to individual ones of said data and control input conductors by user-programmable interconnect elements; and
   an inverter having an input connected to a first one of said interconnect conductors and an output connected to a second one of said interconnect conductors.

9. The combinatorial logic unit of claim 8 wherein said first logic gate is an AND gate and said second logic gate is an OR gate.

10. The combinatorial logic unit of claim 8 wherein said user-programmable interconnect elements are antifuses.

11. A sequential logic unit comprising:
   a data flip-flop having a data input, a clock input, and an output;
   a first data multiplexer having a first data input connected to a first data input conductor, a second data input connected to a second data input conductor, a control input connected to a first control input conductor, and an output;

a second data multiplexer having a first data input connected the output of said data flip-flop, a second data input connected to said output of said first multiplexer, a control input, and an output connected to the data input of said data flip-flop;

a clock multiplexer having a first data input connected to a global clock conductor, a second data input connected to the complement of the signal on said global clock conductor, a third data input connected to a clock input conductor, a fourth data input connected to the complement of the signal on said clock input conductor, a first control input connected to a clock select control input conductor, a second control input connected to a clock polarity control input conductor, and an output connected to said clock input of said data flip-flop;

an output buffer having an input connected to said output of said data flip-flop output, and an output connected to an output conductor; and a plurality of general interconnect conductors, at least some of said general interconnect conductors intersecting said data, clock, and control input conductors of said first, second, and third multiplexers, said plurality of general interconnect conductors selectively connectable to individual ones of said data, clock, and control input conductors by user-programmable interconnect elements.

12. The sequential logic unit of claim 11 further including:

a set input connected to a set input conductor, said set input conductor intersecting at least some of said general interconnect conductors and connectable to least some of said general interconnect conductors by user-programmable interconnect elements; and a reset input connected to a reset input conductor, said reset input conductor intersecting at least some of said general interconnect conductors and connectable to least some of said general interconnect conductors by user-programmable interconnect elements.

13. A programmable logic module comprising:

a first multiplexer having a first data input connected to a first data input conductor, a second data input connected to a second data input conductor, a control input, and an output;

a second multiplexer having a first data input connected to a third data input conductor, a second data input connected to a fourth data input conductor, a control input, and an output;

a third multiplexer having a first data input connected to the output of said first multiplexer, a second data input connected to the output of said second multiplexer, a control input, and an output;

a first logic gate having a first input connected to a fifth data input conductor, a second input connected to a sixth data input conductor and an output connected to the control inputs of said first and second multiplexers;

a second logic gate having a first input connected to a seventh data input conductor, a second input connected to an eighth data input conductor and an output connected to the control input of said third multiplexer;

a first output buffer having an input connected to said output of said third multiplexer and an output connected to a first output conductor;

a data flip-flop having a data input, a clock input, and an output;

a fourth data multiplexer having a first data input connected to the output of said first output buffer, a second data input connected to a ninth data input conductor, a control input connected to a first control input conductor, and an output;

a fifth data multiplexer having a first data input connected the output of said data flip-flop, a second data input connected to the output of said fourth multiplexer, a control input connected to a second control input conductor, and an output connected to the data input of said data flip-flop;

a clock multiplexer having a first data input connected to a global clock conductor, a second data input connected to the complement of the signal on said global clock conductor, a third data input connected to a clock input conductor, a fourth data input connected to the complement of the signal on said clock input conductor, a first control input connected to a clock select control input conductor, a second control input connected to a clock polarity control input conductor, and an output connected to said clock input of said data flip-flop;

a second output buffer having an input connected to said output of said data flip-flop output, and an output connected to a second output conductor;

a plurality of general interconnect conductors, at least some of said general interconnect conductors intersecting said data, clock, and control input conductors of said first, second, third fourth fifth and said clock multiplexers and said first and second output conductors of said first and second output buffers, said plurality of general interconnect conductors selectively connectable to individual ones of said data, clock, and control input conductors by user-programmable interconnect elements; and an inverter having an input connected to a first one of said interconnect conductors and an output connected to a second one of said interconnect conductors.

14. The programmable logic module of claim 13 wherein said data flip-flop further includes:

a set input connected to a set input conductor, said set input conductor intersecting at least some of said general interconnect conductors and connectable to least some of said general interconnect conductors by user-programmable interconnect elements; and a reset input connected to a reset input conductor, said reset input conductor intersecting at least some of said general interconnect conductors and connectable to least some of said general interconnect conductors by user-programmable interconnect elements.

15. The programmable logic module of claim 13 wherein said first logic gate is an AND gate and said second logic gate is an OR gate.

16. The programmable logic module of claim 13 wherein said user-programmable interconnect elements are antifuses.

17. A programmable logic module comprising:

a first multiplexer having a first data input connected to a first data input conductor, a second data input connected to a second data input conductor, a control input, and an output;

a second multiplexer having a first data input connected to a third data input conductor, a second data input connected to a fourth data input conductor, a control input, and an output;

a third multiplexer having a first data input connected to the output of said first multiplexer, a second data input connected to the output of said second multiplexer, a control input, and an output;

a first logic gate having a first input connected to a fifth data input conductor, a second input connected to a sixth data input conductor and an output connected to the control inputs of said first and second multiplexers;

a second logic gate having a first input connected to a seventh data input conductor, a second input connected to an eighth data input conductor and an output connected to the control input of said third multiplexer;

a first output buffer having an input connected to said output of said third multiplexer and an output;

a data flip-flop having a data input, a clock input, and an output;

a fourth data multiplexer having a first data input connected to the output of said first output buffer, a second data input connected to a ninth data input conductor, a control input connected to a first control input conductor, and an output;

a fifth data multiplexer having a first data input connected the output of said data flip-flop, a second data input connected to the output of said fourth multiplexer, a control input connected to a second control input conductor, and an output connected to the data input of said data flip-flop;

a clock multiplexer having a first data input connected to a global clock conductor, a second data input connected to the complement of the signal on said global clock conductor, a third data input connected to a clock input conductor, a fourth data input connected to the complement of the signal on said clock input conductor, a first control input connected to a clock select control input conductor, a second control input connected to a clock polarity control input conductor, and an output connected to said clock input of said data flip-flop;

a second output buffer having an input connected to said output of said data flip-flop output, and an output connected to an output conductor;

a plurality of general interconnect conductors, at least some of said general interconnect conductors intersecting said data, clock, and control input conductors of said first, second, third fourth fifth and said clock multiplexers, said plurality of general interconnect conductors selectively connectable to individual ones of said data, clock, and control input conductors by user-programmable interconnect elements;

a plurality of local interconnect conductors, a first one of said local interconnect conductors connected to the output of said first output buffer, a second one of said local interconnect conductors connected to the output of said second output buffer, at least some of said local interconnect conductors intersecting said data, clock, and control input conductors of said first, second, third fourth fifth and said clock multiplexers, said plurality of general interconnect conductors selectively connectable to individual ones of said data, clock, and control input conductors by user-programmable interconnect elements; and an inverter having an input connected to a first one of said interconnect conductors and an output connected to a second one of said interconnect conductors.

18. The programmable logic module of claim 17 wherein said data flip-flop further includes:

a set input connected to a set input conductor, said set input conductor intersecting at least some of said general interconnect conductors and connectable to least some of said general interconnect conductors by user-programmable interconnect elements; and a reset input connected to a reset input conductor, said reset input conductor intersecting at least some of said general interconnect conductors and connectable to least some of said general interconnect conductors by user-programmable interconnect elements.

19. The programmable logic module of claim 17 wherein said first logic gate is an AND gate and said second logic gate is an OR gate.

20. The programmable logic module of claim 17 wherein said user-programmable interconnect elements are antifuses.

21. A programmable logic module comprising:

a first multiplexer having a first data input connected to a first data input conductor, a second data input connected to a second data input conductor, a control input, and an output;

a second multiplexer having a first data input connected to a third data input conductor, a second data input connected to a fourth data input conductor, a control input, and an output;

a third multiplexer having a first data input connected to the output of said first multiplexer, a second data input connected to the output of said second multiplexer, a control input, and an output;

a first logic gate having a first input connected to a fifth data input conductor, a second input connected to a sixth data input conductor and an output connected to the control inputs of said first and second multiplexers;

a second logic gate having a first input connected to a seventh data input conductor, a second input connected to an eighth data input conductor and an output connected to the control input of said third multiplexer;

a first output buffer having an input connected to said output of said third multiplexer and an output;

a first data flip-flop having a data input, a clock input, and an output;

a fourth data multiplexer having a first data input connected to the output of said first output buffer, a second data input connected to a ninth data input conductor, a control input connected to a first control input conductor, and an output;

a fifth data multiplexer having a first data input connected the output of said first data flip-flop, a second data input connected to the output of said fourth multiplexer, a control input connected to a second control input conductor, and an output connected to the data input of said first data flip-flop;

a first clock multiplexer having a first data input connected to a global clock conductor, a second data input connected to the complement of the signal on said global clock conductor, a third data input connected to a clock input conductor, a fourth data input connected to the complement of the signal on said clock input conductor, a first control input connected to a clock select control input conductor, a second control input connected to a clock polarity control input conductor, and an output connected to said clock input of said data flip-flop;

a second output buffer having an input connected to said output of said first data flip-flop, and an output connected to an output conductor;

a second data flip-flop having a data input, a clock input, and an output;

a sixth data multiplexer having a first data input connected to a tenth data input conductor, a second data input connected to an eleventh data input conductor, a control input connected to a fourth control input conductor, and an output;

a seventh data multiplexer having a first data input connected the output of said second data flip-flop, a second data input connected to the output of said fourth multiplexer, a control input connected to a fifth control input conductor, and an output connected to the data input of said second data flip-flop;

a second clock multiplexer having a first data input connected to a global clock conductor, a second data input connected to the complement of the signal on said global clock conductor, a third data input connected to a clock input conductor, a fourth data input connected to the complement of the signal on said clock input conductor, a first control input connected to a clock select control input conductor, a second control input connected to a clock polarity control input conductor, and an output connected to said clock input of said data flip-flop;

a third output buffer having an input connected to said output of said second data flip-flop, and an output connected to an output conductor;

a plurality of general interconnect conductors, at least some of said general interconnect conductors forming first intersections with at least some of said first through eleventh data input conductors, said first through sixth control input conductors said first and second clock multiplexers, and said first and second clock control input and clock control polarity input conductors;

a plurality of local interconnect conductors, a first one of said local interconnect conductors connected to the output of said first output buffer, a second one of said local interconnect conductors connected to the output of said second output buffer, at least some of said local interconnect conductors forming second intersections with at least some of said first through eleventh data input conductors, said first through sixth control input conductors said first and second clock multiplexers, and said first and second clock control input and clock control polarity input conductors;

an inverter having an input connected to a first one of said interconnect conductors and an output connected to a second one of said interconnect conductors; and a plurality of user-programmable interconnect elements disposed at selected ones of said first and second intersections.

22. The programmable logic module of claim 21 wherein at least one of said first and second data flip-flops further includes:

a set input connected to a set input conductor, said set input conductor intersecting at least some of said general interconnect conductors and connectable to least some of said general interconnect conductors by user-programmable interconnect elements; and a reset input connected to a reset input conductor, said reset input conductor intersecting at least some of said general interconnect conductors and connectable to least some of said general interconnect conductors by user-programmable interconnect elements.

23. The programmable logic module of claim 21 wherein said first logic gate is an AND gate and said second logic gate is an OR gate.

24. The programmable logic module of claim 21 wherein said user programmable interconnect elements are antifuses.

* * * * *

UNITED STATES PATENT AND TRADEMARK OFFICE
CERTIFICATE OF CORRECTION

PATENT NO. : 5,451,887
DATED : September 19, 1995
INVENTOR(S) : Khaled El-Ayat, King W. Chan, William C. Plants It is certified that error appears in the above-indentified patent and that said Letters Patent is hereby corrected as shown below:

On cover page, under item [19], replace "El-Avat" with --El-Ayat--.
On cover page, under item [75], replace "El-Avat" with --El-Ayat--.

Signed and Sealed this

Twenty-eighth Day of May, 1996

Attest:

BRUCE LEHMAN

*Attesting Officer*   Commissioner of Patents and Trademarks